United States Patent
Beck

(10) Patent No.: US 11,831,291 B2
(45) Date of Patent: Nov. 28, 2023

(54) JOSPHSON BAND PASS TO BAND STOP FILTER

(71) Applicant: International Business Machines Corporation, Armonk, NY (US)

(72) Inventor: Matthew Beck, Danbury, CT (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 154 days.

(21) Appl. No.: 17/543,095

(22) Filed: Dec. 6, 2021

(65) Prior Publication Data

US 2023/0179175 A1    Jun. 8, 2023

(51) Int. Cl.
 H03K 17/92   (2006.01)
 H03H 11/04   (2006.01)

(52) U.S. Cl.
 CPC .......... *H03H 11/04* (2013.01); *H03K 17/92* (2013.01); *H03H 2011/0488* (2013.01)

(58) Field of Classification Search
 CPC ...................................... H03K 17/92
 USPC ........................................ 327/528
 See application file for complete search history.

(56) References Cited

U.S. PATENT DOCUMENTS

| 8,392,495 | B2 | 3/2013 | Morgan |
| 9,735,776 | B1 | 8/2017 | Abdo |
| 9,768,771 | B2 | 9/2017 | Naaman |
| 9,787,278 | B1 | 10/2017 | Abdo |
| 10,628,752 | B2 | 4/2020 | Abdo |
| 10,998,869 | B2 | 5/2021 | Miano et al. |
| 2021/0234086 | A1 | 7/2021 | Lescanne et al. |
| 2021/0265963 | A1* | 8/2021 | Kong ............ H03F 19/00 |

FOREIGN PATENT DOCUMENTS

| WO | 2020139407 | 7/2020 |
| WO | 2020183060 | 9/2020 |

OTHER PUBLICATIONS

Mell et al., "The NIST Definition of Cloud Computing," Recommendations of the National Institute of Standards and Technology, NIST Special Publication 800-145, Sep. 2011, 7 pages.
Naaman et al., "On-chip Josephson junction microwave switch," Appl. Phys. Lett. 108, 112601 (2016); 5 pages.
Morgan et al., "Theoretical and Experimental Study of a New Class of Reflectionless Filter," IEEE Transactions on Microwave Theory and Techniques (vol. 59, Issue: 5, May 2011), 9 pages.
Morgan et al., "Reflectionless Filter Structures," IEEE Transactions on Microwave Theory and Techniques (vol. 63, Issue: 4, Apr. 2015), 10 pages.

* cited by examiner

*Primary Examiner* — Tomi Skibinski
(74) *Attorney, Agent, or Firm* — Amin, Turocy & Watson, LLP

(57) ABSTRACT

One or more systems, devices and/or methods of use provided herein relate to a device that can facilitate selective switching between band pass and band stop filter modes and/or can provide reflectionless or near reflectionless function. A device can comprise a filter circuit coupled between a pair of ports and comprising a direct current superconducting quantum interference device (DC SQUID), wherein the filter circuit is selectively activatable by varying the inductance of the DC SQUID. Applying flux bias to the DC SQUID can allow for the switching between the band pass and band stop filter modes.

20 Claims, 10 Drawing Sheets

JOSPHSON BAND PASS TO BAND STOP FILTER

BACKGROUND

Quantum computing is generally the use of quantum-mechanical phenomena to perform computing and information processing functions. Quantum computing can be viewed in contrast to classical computing, which generally operates on binary values with transistors. That is, while classical computers can operate on bit values that are either 0 or 1, quantum computers operate on quantum bits (qubits) that comprise superpositions of both 0 and 1. Quantum computing has the potential to solve problems that, due to computational complexity, cannot be solved or can only be solved slowly on a classical computer.

On a large scale, quantum computing cloud service providers can execute millions of quantum jobs for users during a year. Each quantum job can include the execution of one or more quantum programs. Where qubit states only can exist (or can only be coherent) for a limited amount of time, an objective of operation of a quantum logic circuit (e.g., including one or more qubits) can be to reduce the time of the operation and/or increase the speed of the operation. Time spent to operate the quantum logic circuit can undesirably reduce the available time of operation on one or more qubits. This can be due to the available coherence time of the one or more qubits prior to decoherence of the one or more qubits. For example, a qubit state can be lost in less than 100 to 200 microseconds in some cases. Further, operations on qubits generally introduce some error, such as some level of decoherence and/or some level of quantum noise, further affecting qubit availability. Quantum noise can refer to noise attributable to the discrete and/or probabilistic natures of quantum interactions. Device designs that prolong the lifetime of the quantum state and extend the coherence time can be desirable.

Also, on the large scale, a large quantity of quantum jobs can create pressure to execute the respective quantum programs quickly. That is, increased speed of execution can directly and/or indirectly correlate to maximizing system usage, minimizing users having to wait for measurement results, and/or minimizing undesirable consuming of classical computational resources. Pressure also can be created to execute these quantum jobs well, so that a most performance can be extracted from near-term error-prone systems and/or so that a quality of measurements relative to the one or more qubits of the respective quantum systems compiling into physical-level pulses can be improved (e.g., related to accuracy, precision and/or measurement efficiency).

Physical, real-world, quantum logic circuits controlled by a quantum system can include a plurality of qubits. One type of qubit, a superconducting qubit, can include a Josephson junction, and operates generally only within a cryogenic chamber, such as a dilution refrigerator. One or more such superconducting qubits can be multiplexed per measurement circuit contained within the cryogenic chamber.

SUMMARY

The following presents a summary to provide a basic understanding of one or more embodiments described herein. This summary is not intended to identify key or critical elements, delineate scope of particular embodiments or scope of claims. Its sole purpose is to present concepts in a simplified form as a prelude to the more detailed description that is presented later. In one or more embodiments described herein, systems, computer-implemented methods, apparatus and/or computer program products facilitate coupling in and decoupling between control electronics and a circuit being controlled. In the quantum computing space, one or more embodiments described herein can facilitate coupling in control (readout) electronics in a room temperature environment to one or more superconducting qubits in a cryogenic environment.

In accordance with an embodiment, a device can comprise a filter circuit coupled between a pair of ports and comprising a direct current superconducting quantum interference device (DC SQUID), wherein the filter circuit is selectively activatable by varying the inductance of the DC SQUID.

In accordance with another embodiment, a system can comprise a processor, a measurement readout circuit, and a filter circuit connected between the processor and the measurement readout circuit, wherein the filter circuit comprises a direct current superconducting quantum interference device (DC SQUID), wherein critical current of the DC SQUID is selectively modulable to increase the inductance of the DC SQUID.

In accordance with yet another embodiment, a method can comprise selectively modulating, by a device operatively coupled to a processor, inductance of a direct current superconducting quantum interference device (DC SQUID) coupled between a pair of ports.

DETAILED DESCRIPTION

Figure 1:
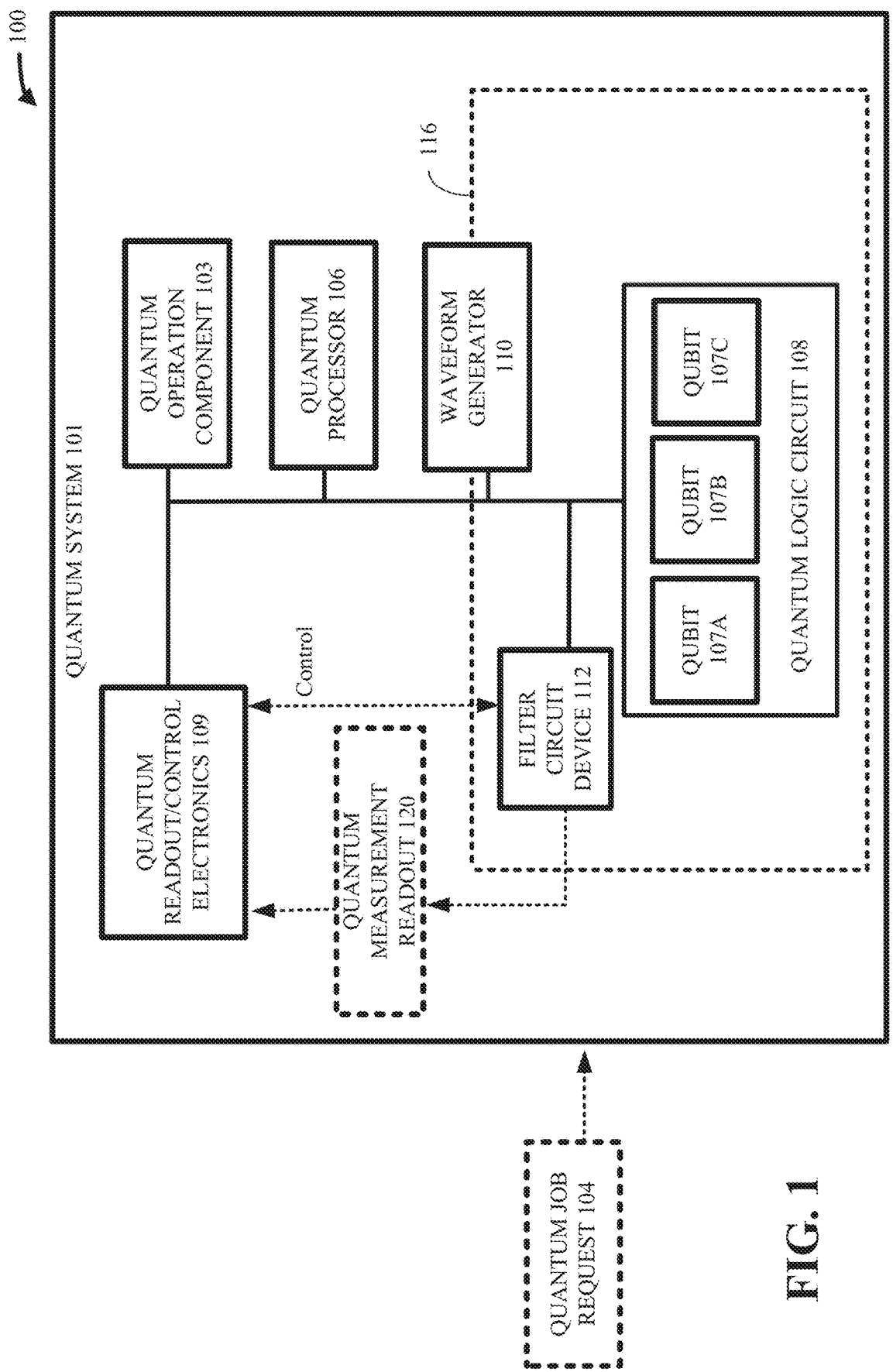
FIG. 1 illustrates a block diagram of an example, non-limiting system that can facilitate operation of one or more qubits, in accordance with one or more embodiments described herein.

The following detailed description is merely illustrative and is not intended to limit embodiments and/or application or utilization of embodiments. Furthermore, there is no intention to be bound by any expressed or implied information presented in the preceding Summary section, or in the Detailed Description section. One or more embodiments are now described with reference to the drawings, wherein like reference numerals are utilized to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Quantum computation utilizes a qubit as its essential unit instead of a classical computing bit. A qubit (e.g., quantum binary digit) is a quantum-mechanical analog of a classical bit. Whereas classical bits can employ only one of two basis states (e.g., 0 or 1), qubits can employ superpositions of those basis states (e.g., $\alpha|0\rangle + \beta|1\rangle$), where $\alpha$ and $\beta$ are complex scalars (such that $|\alpha|^2 + |\beta|^2 = 1$), allowing several qubits to theoretically hold exponentially more information than the same number of classical bits. Thus, quantum computers (e.g., computers that employ qubits instead of solely classical bits) can, in theory, quickly solve problems that can be extremely difficult for classical computers. The bits of a classical computer are simply binary digits, with a value of either 0 or 1. Almost any device with two distinct states can serve to represent a classical bit: a switch, a valve, a magnet, a coin, or similar binary-type state measure. Qubits, partaking of the quantum mystique, can occupy a superposition of 0 and 1 states. It is not that the qubit can have an intermediate value, such as 0.63; when the state of the qubit is measured, the result is either 0 or 1. But in the course of a computation, a qubit can act as if it were a mixture of states—for example: 63 percent 0 and 37 percent 1.

Indeed, general quantum programs can employ coordination of quantum and classical parts of a computation. One way to contemplate general quantum programs is to identify processes and abstractions involved in specifying a quantum algorithm, transforming the algorithm into executable form, running an experiment or simulation, and analyzing the results. A notion throughout these processes is use of intermediate representations. An intermediate representation (IR) of computation is neither its source language description nor target machine instructions, but something in between. Compilers can utilize several IRs during a process of translating and optimizing a program. An input is a source code describing a quantum algorithm and compile time parameter(s). An output is a combined quantum/classical program expressed using a high-level IR. A distinction between quantum and classical computers is that the quantum computer is probabilistic, thus measurements of algorithmic outputs provide a proper solution within an algorithm specific confidence interval. Computation is repeated until a satisfactory probable certainty of solution can be achieved.

By processing information using laws of quantum mechanics, quantum computers can offer novel ways to perform computation tasks such as molecular calculations, optimization, and many more. Many algorithms and system components can be introduced to perform such computational tasks efficiently.

In current technologies, passive elements such as band pass filters (BPFs), band stop filters (BSFs) and/or attenuators can be employed for the routing of control and/or bias signals in microwave networks and/or for the suppression of out-of-band standing waves, such as from slight Z mismatches in the wiring network at connection points and/or the suppression of noise. Generally, reflectionless filters can take BPFs and BSFs another level by theoretically matching an out of band signal to ground thus yielding generally zero reflections. However, existing technologies lack control in the out of band signals. Instead, such out of band signals are simply reflected back into the system and can result in standing waves should an impedance mismatch be encountered.

In the quantum space, and/or in other spaces, it can be desirable to selectively control the ability to couple and decouple sections of electronics. Disconnecting the sections of electronics can limit and/or prevent backaction from one set of electronics affecting another set of electronics. Thus, the sections of electronics would be non-universally coupled, although selective coupling would allow for control and/or readout to be executed between the sections of electronics. In the quantum space in particular, such brief selective connection and/or disconnection as provided by one or more embodiments described herein can thus be desirable between room temperature electronics and cryogenic environment electronics, for example.

One or more embodiments described herein relate to dynamic modulation of a circuit to transform the circuit from a band pass filter (e.g., generally reflectionless) to a band stop filter (e.g., generally reflectionless-like). That is, one or more embodiments described herein relate to selective coupling in and decoupling between a control circuit and a circuit being controlled, also referred to herein as a controllable circuit, and/or between a readout circuit and a circuit being read. The selective coupling can be provided by a filter circuit that can selectively switch from band pass function to band stop function. This selective function can allow for brief, such as quick, connection and/or routing of control and/or bias signals in a microwave network. When selectively reverted to band stop function, the filter circuit can allow for suppression of standing waves, such as from slight Z mismatches in the wiring network at connection points. This effect also can be achieved when in band pass configuration.

In the quantum space, the filter circuit, when employed at a cryogenic environment, and when in a band stop mode, can suppress deleterious effects, such as noise, between room temperature control electronics, such as readout/control electronics, and superconducting qubits in the cryogenic environment. In a band pass mode, the filter circuit can allow for control/readout of the superconducting qubits by the room temperature control electronics, such as to facilitate readout of one or more states or resonant frequencies of one or more physical, real-world qubits in the cryogenic environment.

Furthermore, in one or more embodiments, a filter circuit described herein can provide majoratively reflectionless, near reflectionless and/or reflectionless filtering, such as by majoratively matching, near matching and/or perfectly matching an out of band signal to ground to yield majoratively no or zero reflections. As used herein, the term "reflectionless" can mean any of generally reflectionless, majoratively reflectionless, near reflectionless, reflectionless-like and/or perfectly reflectionless.

For example, in the control and/or readout of superconducting quantum systems, it can be desirable to briefly, such as quickly, couple in and couple out (e.g., decouple) the control and/or readout signals between room temperature electronics and cryogenic environment electronics while executing a sequence of one or more gates on one or more superconducting qubits and/or while reading out one or more states and/or resonant frequencies of one or more superconducting qubits. It further can be desirable to quickly decouple the cryogenic environment electronics again, from the room temperature electronics, such as to prevent unwanted backaction from the room temperature control and/or readout electronics from affecting the superconducting qubits and/or function of the cryogenic environment electronics of the superconducting quantum system.

Additionally, the one or more filter circuits, filter circuit devices, systems and/or methods described herein can provide utility outside of the quantum space, such as relative to any suitable microwave network, such as comprising routing of control and/or bias signals. These filters can also serve as fast (~ns switching time) single-pole single-throw (SPST) microwave switches with enhanced out of band control characteristics.

One or more embodiments are now described with reference to the drawings, where like referenced numerals are used to refer to like elements throughout. As used herein, the terms "entity", "requesting entity" and "user entity" can refer to a machine, device, component, hardware, software, smart device and/or human. In the following description, for purposes of explanation, numerous specific details are set forth in order to provide a more thorough understanding of the one or more embodiments. It is evident, however, in various cases, that the one or more embodiments can be practiced without these specific details.

Generally, the subject computer processing system(s), methods, apparatuses, devices and/or computer program products can be employed to solve new problems that can arise through advancements in technology, computer networks, the Internet and the like.

Further, the embodiments depicted in one or more figures described herein are for illustration only, and as such, the architecture of embodiments is not limited to the systems, devices and/or components depicted therein, nor to any particular order, connection and/or coupling of systems, devices and/or components depicted therein. For example, in one or more embodiments, the non-limiting systems described herein, such as non-limiting system 100 as illustrated at FIG. 1, and/or systems thereof, can further comprise, be associated with and/or be coupled to one or more computer and/or computing-based elements described herein with reference to an operating environment, such as the operating environment 800 illustrated at FIG. 8. In one or more described embodiments, computer and/or computing-based elements can be used in connection with implementing one or more of the systems, devices, components and/or computer-implemented operations shown and/or described in connection with FIG. 1 and/or with other figures described herein.

Turning first generally to FIG. 1, one or more embodiments described herein can include one or more devices, systems and/or apparatuses that can facilitate executing one or more quantum operations to facilitate output of one or more quantum results. For example, FIG. 1 illustrates a block diagram of an example, non-limiting system 100 that can enhance execution of a quantum job, such as by enhancing power consumption relative to arbitrary waveform generation relative to the quantum job.

The quantum system 101 (e.g., quantum computer system, superconducting quantum computer system and/or the like) can employ quantum algorithms and/or quantum circuitry, including computing components and/or devices, to perform quantum operations and/or functions on input data to produce results that can be output to an entity. The quantum circuitry can comprise quantum bits (qubits), such as multi-bit qubits, physical circuit level components, high level components and/or functions. The quantum circuitry can comprise physical pulses that can be structured (e.g., arranged and/or designed) to perform desired quantum functions and/or computations on data (e.g., input data and/or intermediate data derived from input data) to produce one or more quantum results as an output. The quantum results, e.g., quantum measurement 120, can be responsive to the quantum job request 104 and associated input data and can be based at least in part on the input data, quantum functions and/or quantum computations.

In one or more embodiments, the quantum system 101 can comprise one or more quantum components, such as a quantum operation component 103, a quantum processor 106, quantum readout/control electronics 109, a waveform generator 110, filter circuit device 112 and/or a quantum logic circuit 108 comprising one or more qubits (e.g., qubits 107A, 107B and/or 107C), also referred to herein as qubit devices 107A, 107B and 107C.

The quantum processor 106 can be any suitable processor. The quantum processor 106 can generate one or more instructions for controlling the one or more processes of the quantum operation component 103 and/or for controlling the quantum logic circuit 108 and/or waveform generator 110.

The quantum operation component 103 can obtain (e.g., download, receive, search for and/or the like) a quantum job request 104 requesting execution of one or more quantum programs. The quantum operation component 103 can determine one or more quantum logic circuits, such as the quantum logic circuit 108, for executing the quantum program. The request 104 can be provided in any suitable format, such as a text format, binary format and/or another suitable format. In one or more embodiments, the request 104 can be received by a component other than a component of the quantum system 101, such as a by a component of a classical system coupled to and/or in communication with the quantum system 101.

The waveform generator 110 can perform one or more quantum processes, calculations and/or measurements for operating one or more quantum circuits on the one or more qubits 107A, 107B and/or 107C. For example, the waveform generator 110 can operate one or more qubit effectors, such as qubit oscillators, harmonic oscillators, pulse generators and/or the like to cause one or more pulses to stimulate and/or manipulate the state(s) of the one or more qubits 107A, 107B and/or 107C comprised by the quantum system 101. That is, the waveform generator 110, such as in combination with the quantum processor 106, can execute operation of a quantum logic circuit on one or more qubits of the circuit (e.g., qubit 107A, 107B and/or 107C). In response, the quantum operation component 103 can output one or more quantum job results, such as one or more quantum measurements 120, in response to the quantum job request 104.

The quantum logic circuit 108 and a portion or all of the waveform generator 110 can be contained in a cryogenic environment, such as generated by a cryogenic chamber 116, such as a dilution refrigerator. Indeed, a signal can be generated by the waveform generator 110 within the cryogenic chamber 116 to affect the one or more qubits 107A-C. Where qubits 107A, 107B and 107C are superconducting qubits, cryogenic temperatures, such as about 4K or lower can be employed to facilitate function of these physical qubits. Accordingly, the elements of the quantum measurement circuit 110 also are to be constructed to perform at such cryogenic temperatures.

The quantum readout/control electronics 109 can be any suitable components for controlling one or more operations of cryogenic environment components within the cryogenic chamber 116, such as the quantum logic circuit 108. The quantum readout/control electronics 109 further can perform readout of one or more measurements, such as relative to one or more states and/or one or more frequencies, such as resonant frequencies, of one or more qubits of the quantum logic circuit 108.

The filter circuit device 112, in accordance with one or more embodiments described herein, generally can function in a band pass filter (BPF) mode or a band stop filter (BSF) mode via dynamic modulation of a portion, such as a DC SQUID, of the filter device 112. As will be described in further detail below, in the quantum space, the filter circuit device 112, when employed at a cryogenic environment, and when in a band stop filter mode, can suppress out of band noise, between room temperature control electronics, such as readout electronics and superconducting qubits in the cryogenic environment. In a band pass filter mode, the filter circuit can allow for control of the superconducting qubits by the room temperature control electronics, such as to facilitate readout of one or more states or resonant frequencies of one or more physical, real-world qubits in the cryogenic environment, while still suppressing out of band noise from reaching the superconducting qubits.

The filter circuit device 112 can be controlled by any suitable component of the quantum system 101, such as by the processor 106. For example, control can be provided to dynamically modulate one or more DC SQUIDs of the filter circuit device 112, such as to control application of flux bias by activating and/or deactivating one or more flux control lines.

The filter circuit device 112 can be connected to the quantum processor 106. In one embodiment, the filter circuit device 112 can be connected between the readout/control electronics 109 and the quantum logic circuit 108. In another embodiment, readout/control electronics 109 can be separate readout electronics and control electronics, and the filter circuit device 112 can be connected between the separate readout electronics and the quantum logic circuit 108 and/or between the separate control electronics and the quantum logic circuit 108.

The following/aforementioned description(s) refer(s) to the operation of a single quantum program from a single quantum job request. This operation can include one or more controls of and/or readouts from cryogenic environment electronics within cryogenic chamber 116 by room temperature control/readout electronics 109 external to the cryogenic chamber 116. That is, one or more of the processes described herein can be scalable, also such as including additionally, and/or alternatively, execution of one or more quantum programs and/or quantum job requests in parallel with one another.

In one or more embodiments, the non-limiting system 100 can be a hybrid system and thus can include both one or more classical systems, such as a quantum program implementation system, and one or more quantum systems, such as the quantum system 101. In one or more other embodiments, the quantum system 101 can be separate from, but function in combination with, a classical system.

In such case, one or more communications between one or more components of the non-limiting system 100 and a classical system can be facilitated by wired and/or wireless means including, but not limited to, employing a cellular network, a wide area network (WAN) (e.g., the Internet), and/or a local area network (LAN). Suitable wired or wireless technologies for facilitating the communications can include, without being limited to, wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (Ipv6 over Low power Wireless Area Networks), Z-Wave, an ANT, an ultra-wideband (UWB) standard protocol and/or other proprietary and/or non-proprietary communication protocols.

Figure 2:
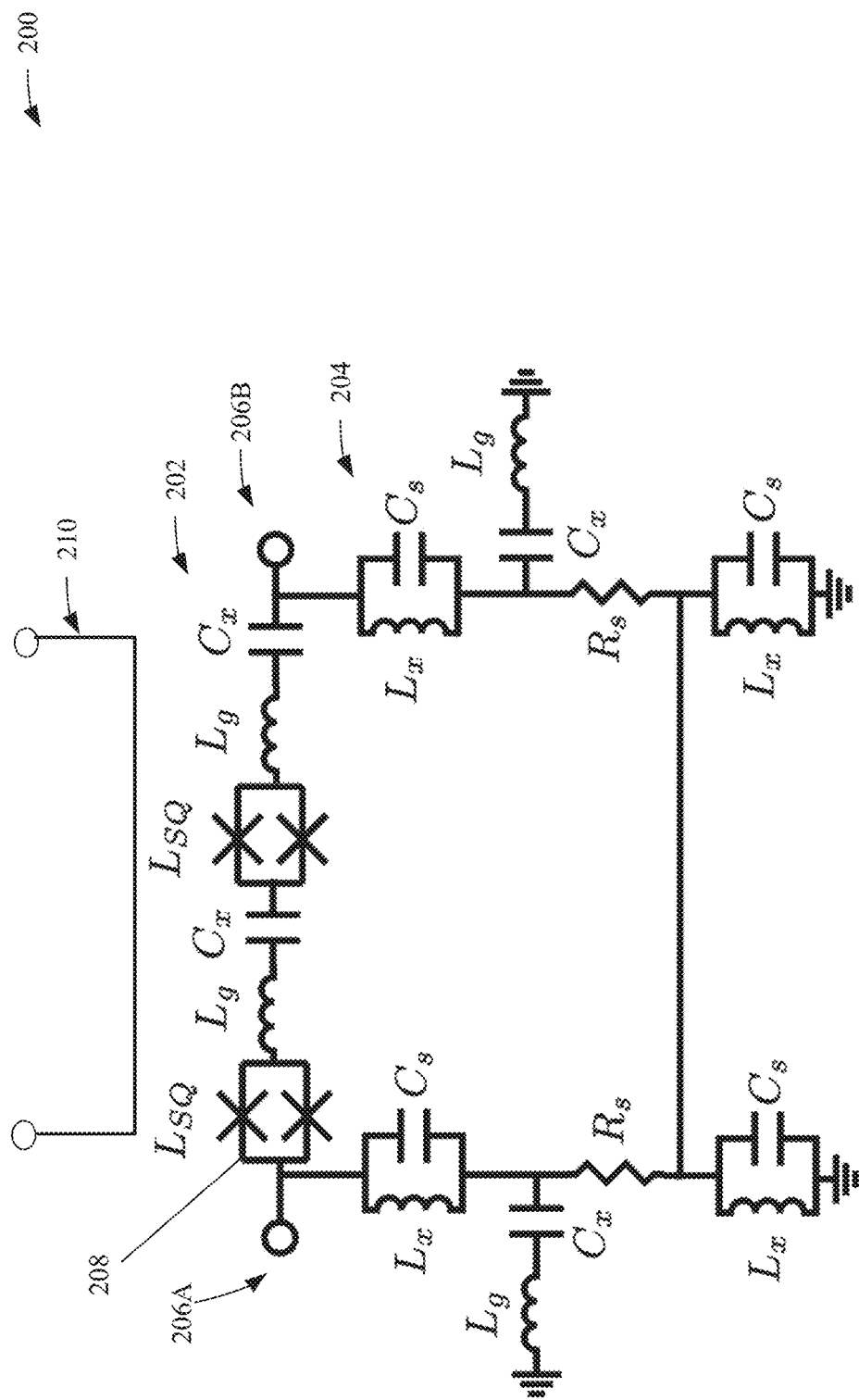
FIG. 2 illustrates a schematic diagram of an example filter circuit device, in accordance with one or more embodiments described herein.

FIG. 2 illustrates a block diagram of an example non-limiting filter circuit device 200 (also herein referred to as a device) that can be employed as the filter circuit device 112 of the quantum system 101 of the non-limiting system 100 of FIG. 1. Repetitive description of like elements employed in one or more embodiments described herein is omitted for sake of brevity.

Generally, the filter circuit device 200 can employ direct current superconducting quantum interference devices (DC SQUIDs) as a portion of or as all inductance of the filter circuit device 200 between ports that connect respectively to the room temperature control/readout electronics and the cryogenic environment electronics, such as superconducting qubits. The filter circuit device 200 can be employed for coupling/decoupling of the control and/or readout of a plurality of superconducting qubits, such as 1 to about 10 qubits and/or such as about 1 to about 5 qubits, from quantum electronics. In accordance therewith, the critical current of the DC SQUIDs can be dynamically modulated, such as in-situ modulation during execution of a quantum program cycle, to switch the filter circuit device 200 between a BPF mode and a BSF mode, and thus between BPF function and BSF function. Where flux bias is applied to the DC SQUIDs, the filter circuit device 200 can be switched from a BPF mode to a BSF mode.

Turning now in particular to the device illustrated at FIG. 2, the filter circuit device 200 can comprise a series section 202 and a shunt section 204 that are connected between a pair of ports 206A and 206B. In use, one port 206A can be connected to measurement readout and/or control electronics, and the other port 206B can be connected to one or more qubits, such as transmon qubits.

The shunt section 204 can comprise inductors and/or capacitors, for example, for constructing a band pass filter, such as a band pass reflectionless filter. The shunt section 204 also can comprise resistors matched to the impedance environment of the quantum system.

The series section 202 can comprise one or more DC SQUIDs 208, each comprising a pair of Josephson junctions connected in parallel, connected in series between the two ports 206A and 206B. In one embodiment, the shunt section 204 can be connected to the line of the series section 202 at locations between one of the DC SQUIDs 208 and one of the two ports 206A and 206B.

As shown, the series section 202 includes one or more other components, such as inductors and/or capacitors. As will be described below with respect to additional embodiments at FIG. 6, DC SQUIDs 208, can in some embodiments, provide all inductance between the ports 206A and 206B.

A biasing line, such as a flux bias control line 210 can also be employed with the filter circuit device 200. As shown, the biasing line 210 can generally be located in proximity to the Josephson junctions of the DC SQUIDs 208 to allow for modulation of the DC SQUID critical current. That is, the DC SQUIDs 208 allow for a degree of tunability of the filter circuit device 200 whereby modulating the DC SQUID inductance, filter characteristics of the filter circuit device 200 can be dynamically changed.

Although a single flux bias control line 210 is shown, a pair of flux bias control lines can be employed to separately bias the DC SQUIDs 208.

Figure 3:
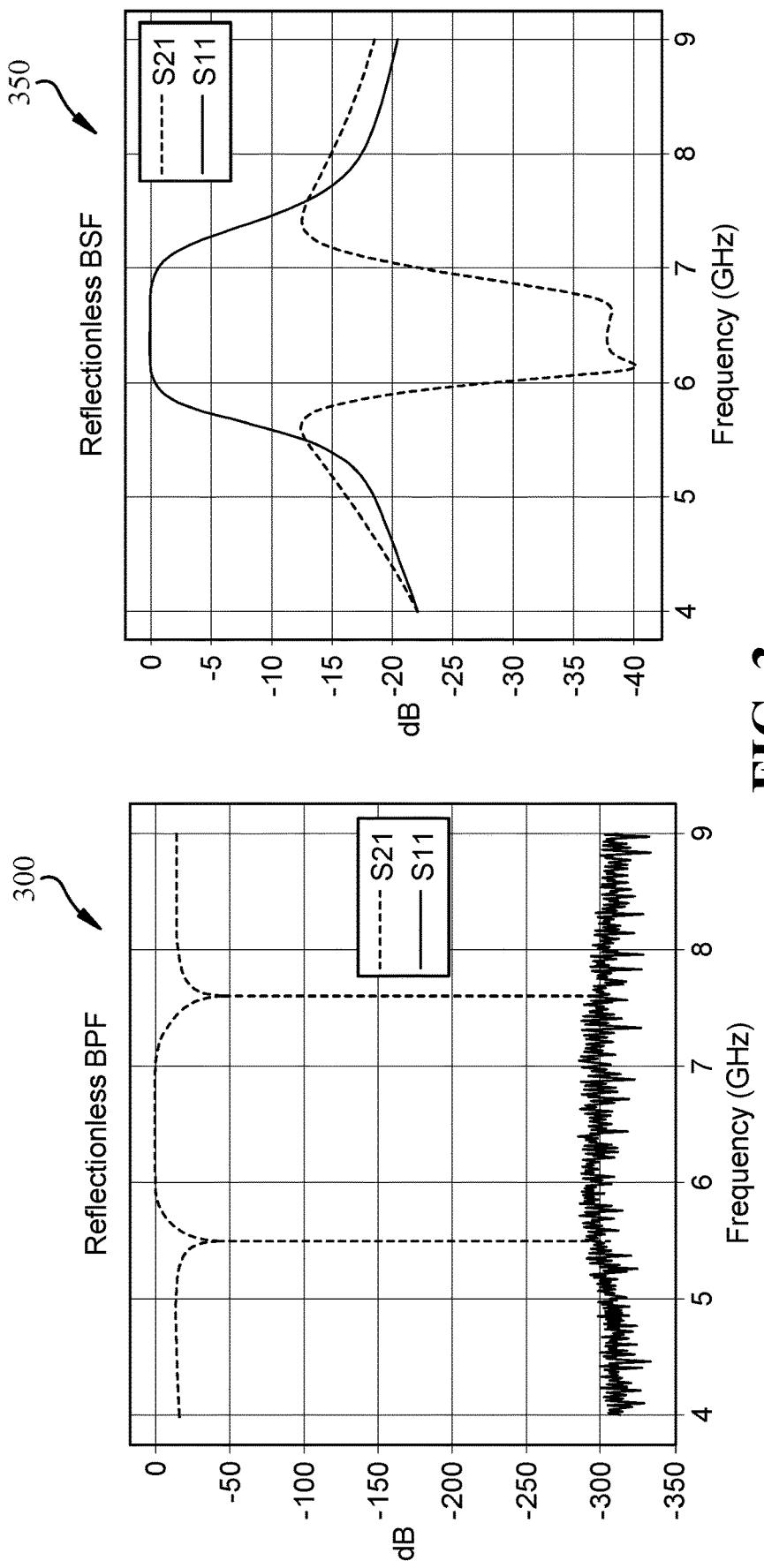
FIG. 3 illustrates a pair of graphs showing generally reflectionless function of the filter circuit device of FIG. 2, in both band pass filter (BPF) mode and band stop filter (BSF) mode, in accordance with one or more embodiments described herein.

Turning now to FIG. 3, and also still referring to FIG. 2, a pair of graphs is provided to illustrate the unique function of the filter circuit device 200. At graphs 300 and 350, frequency in gigahertz (GHz) is graphed against the scattering parameters S21 and S11 in decibels (dB). The simulations are provided via a first suitable software, that can provide linear inductance simulations. As shown at graph 300, in the low inductance state (i.e., with no flux bias applied to the DC SQUIDs 208), the combination of the DC SQUIDs and linear inductances between ports 206A and 206B can provide a generally reflectionless BPF match. In this BPF mode, control and/or readout signals can be communicated between the ports 206A and 206B, such as between room temperature control/readout electronics and qubits and/or read out resonators. As shown at graph 350, current can be applied through a flux control line 210, with flux bias applied to the DC SQUIDs 208, and thus the respective inductances of the DC SQUIDs 208 can be modulated to a high inductance state. That is, the DC SQUIDs 208 can be modulated from a low series inductance to a high series inductance. This modulation of self-inductance of the DC SQUIDs 208 can break an in-band match and change the filter circuit device 200 from a BPF mode to a BSF mode. That is, the match between ports 206A and 206B can be broken only in the original pass band, with out of band performance being similar in BPF and BSF modes.

Figure 4:
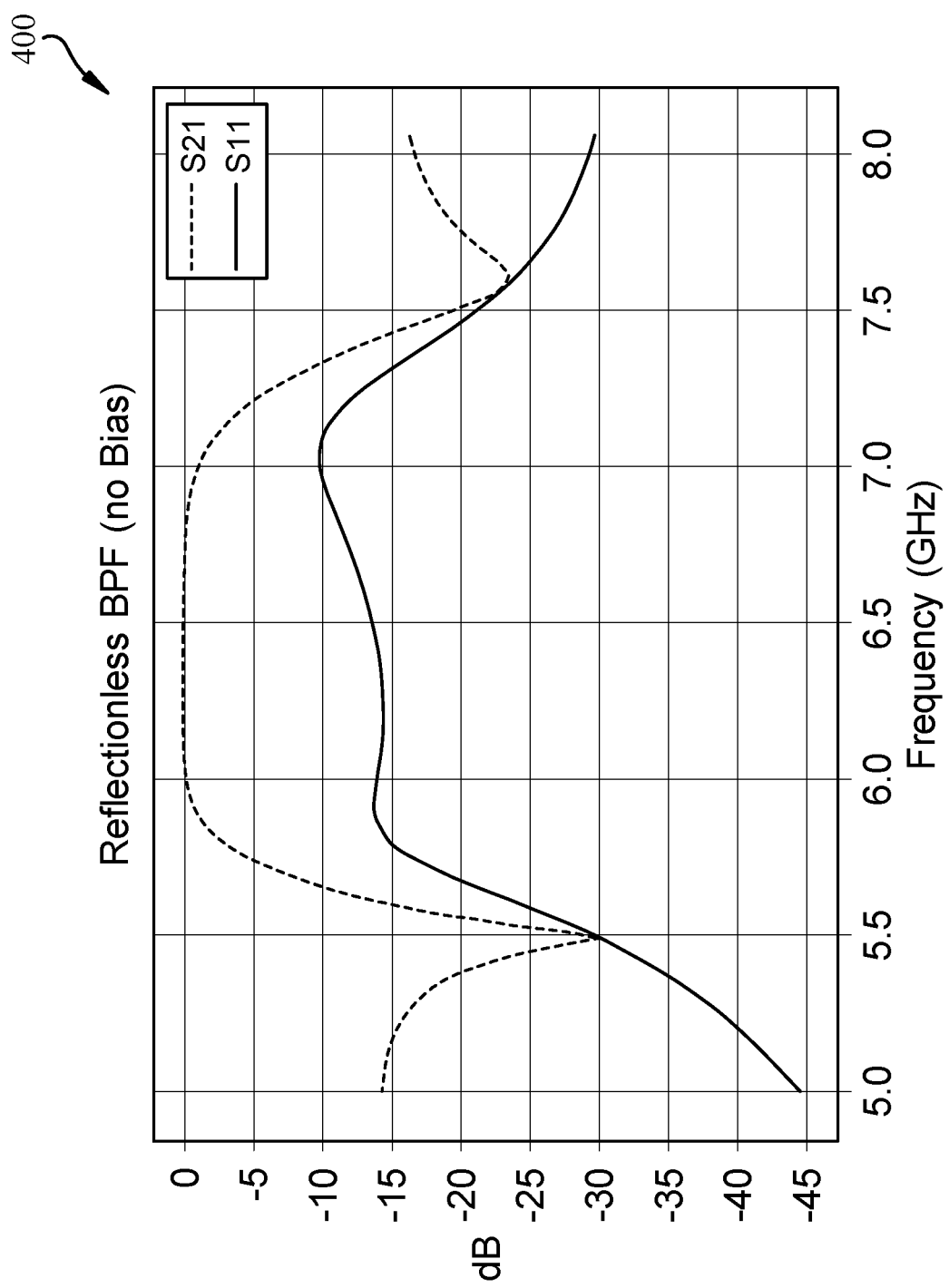
FIG. 4 illustrates a graph showing generally reflectionless function of the filter circuit device of FIG. 2, in band pass filter (BPF) mode, in accordance with one or more embodiments described herein.
Figure 5:
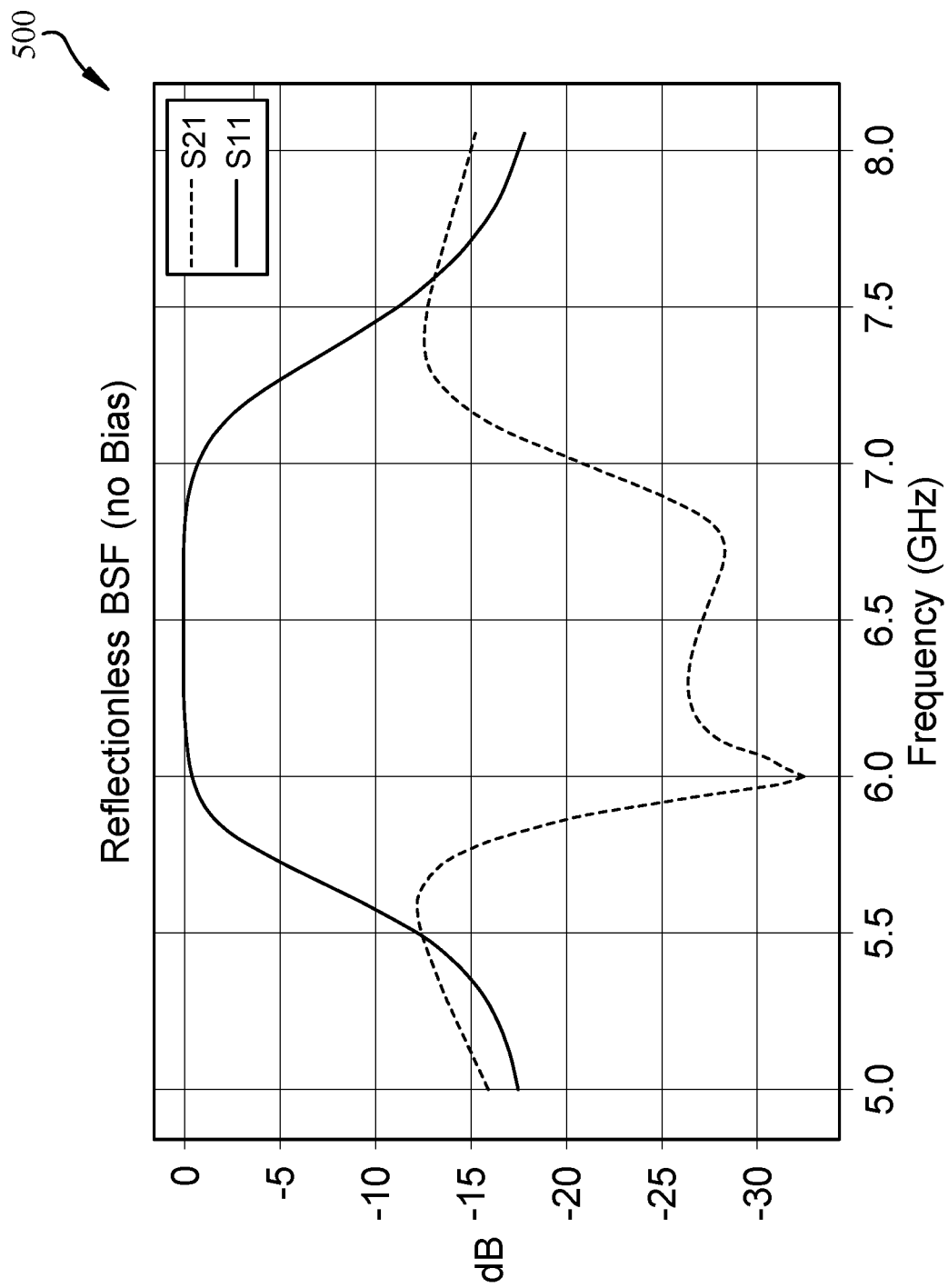
FIG. 5 illustrates a graph showing generally reflectionless function of the filter circuit device of FIG. 2, in band stop filter (BSF) mode, in accordance with one or more embodiments described herein.

Turning now to FIGS. 4 and 5, and also still referring to FIG. 2, another pair of graphs is provided to illustrate the unique function of the filter circuit device 200. At graphs 400 and 500, frequency in gigahertz (GHz) is graphed against the reflection and transmission scattering parameters S11 and S21 in decibels (dB). The simulations are provided via a second suitable software, that can provide non-linear time domain Josephson junction simulation. As shown at graph 400, the scattering parameter performance in the non-linear time domain Josephson junction simulation for the BPF configuration does not have the same performance as the linear simulation in the linear Josephson junction simulation as shown at graph 300 of FIG. 3. This discrepancy in simulation results can be due to the simulator taking into account the full non-linearity of the Josephson Junctions including the inherent self/parasitic capacitance of the junctions. As shown at graph 500, with flux bias applied to the DC SQUIDs 208, modulation can break an in-band match and change the filter circuit device 200 from a BPF mode to a BSF mode.

Figure 6:
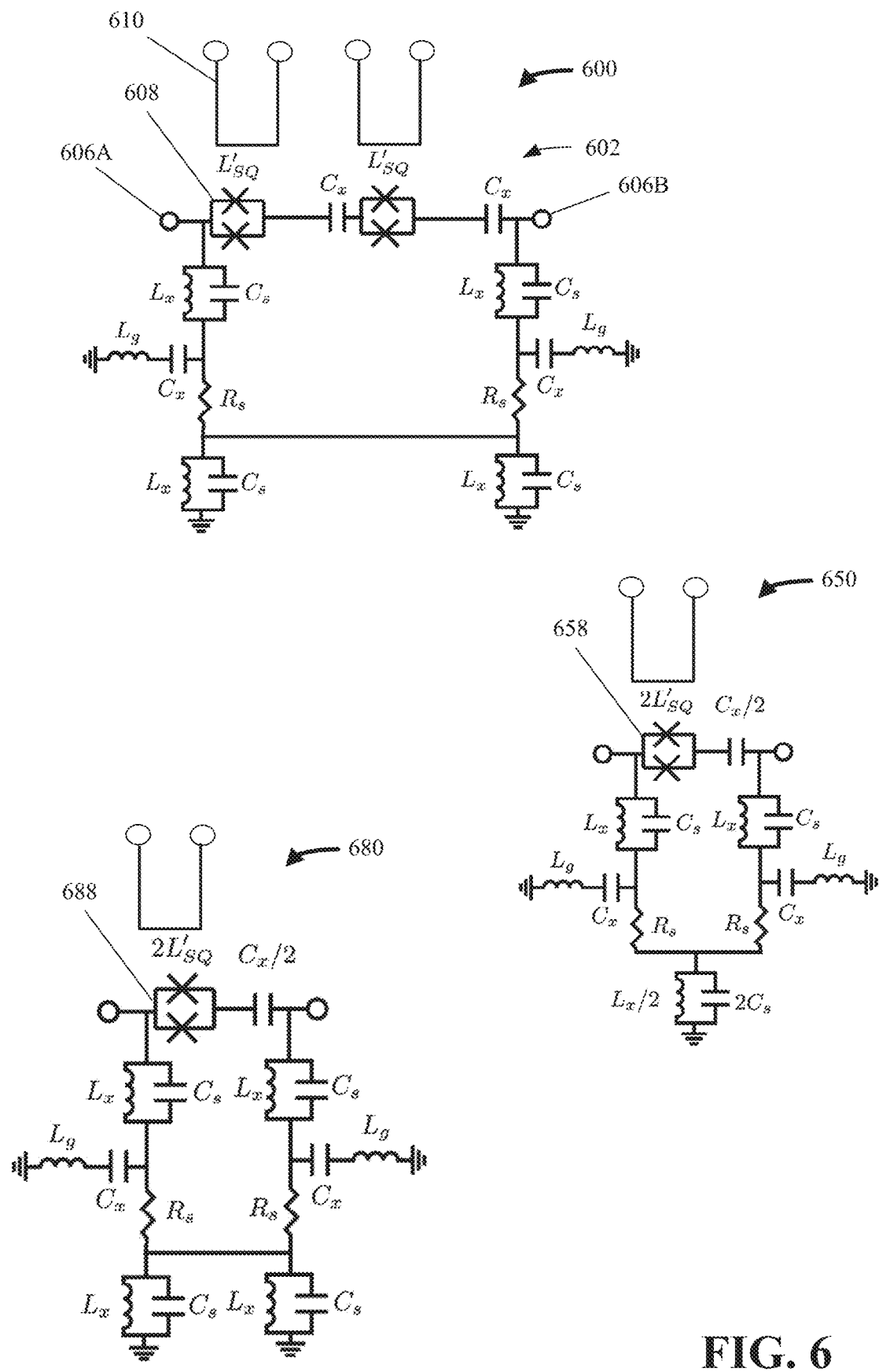
FIG. 6 illustrates three different schematic diagrams of three different embodiments of filter circuit devices, in accordance with one or more embodiments described herein.

Turning now to FIG. 6, three additional embodiments of filter circuit devices are illustrated. Filter circuit devices 600, 650 and 680 each are constructed in accordance with the description provided above for the filter circuit device 200. Repetitive description of like elements and/or processes employed in respective embodiments is omitted for sake of brevity.

Filter circuit device 600 includes all inductance between the ports 606A and 606B being provided by the DC SQUIDs 608. That is, other inductors of the respective inductance section 602 are omitted. Also as shown, a pair of flux bias control lines 610 are employed that can separately bias the DC SQUIDs 608. The DC SQUIDs 608 can provide physical size reduction as compared to the filter circuit device 200 of FIG. 2.

Filter circuit device 650 includes only a single DC SQUID 658 between respective ports, and all other inductance omitted. That is, the DC SQUID 658 provides all inductance between the respective ports. The DC SQUID 658 can provide physical size reduction as compared to the filter circuit device 200 of FIG. 2.

Filter circuit device 680 also includes only a single DC SQUID 688 between respective ports, and all other inductance omitted. That is, the DC SQUID 688 provides all inductance between the respective ports. The DC SQUID 688 can provide physical size reduction as compared to the filter circuit device 200 of FIG. 2.

In one or more other embodiments, more than two DC SQUIDs can be disposed between the respective ports of a filter circuit device. This can allow for higher critical currents and/or for reaching a high inductance in a flux bias state at a lower flux bias current.

Figure 7:
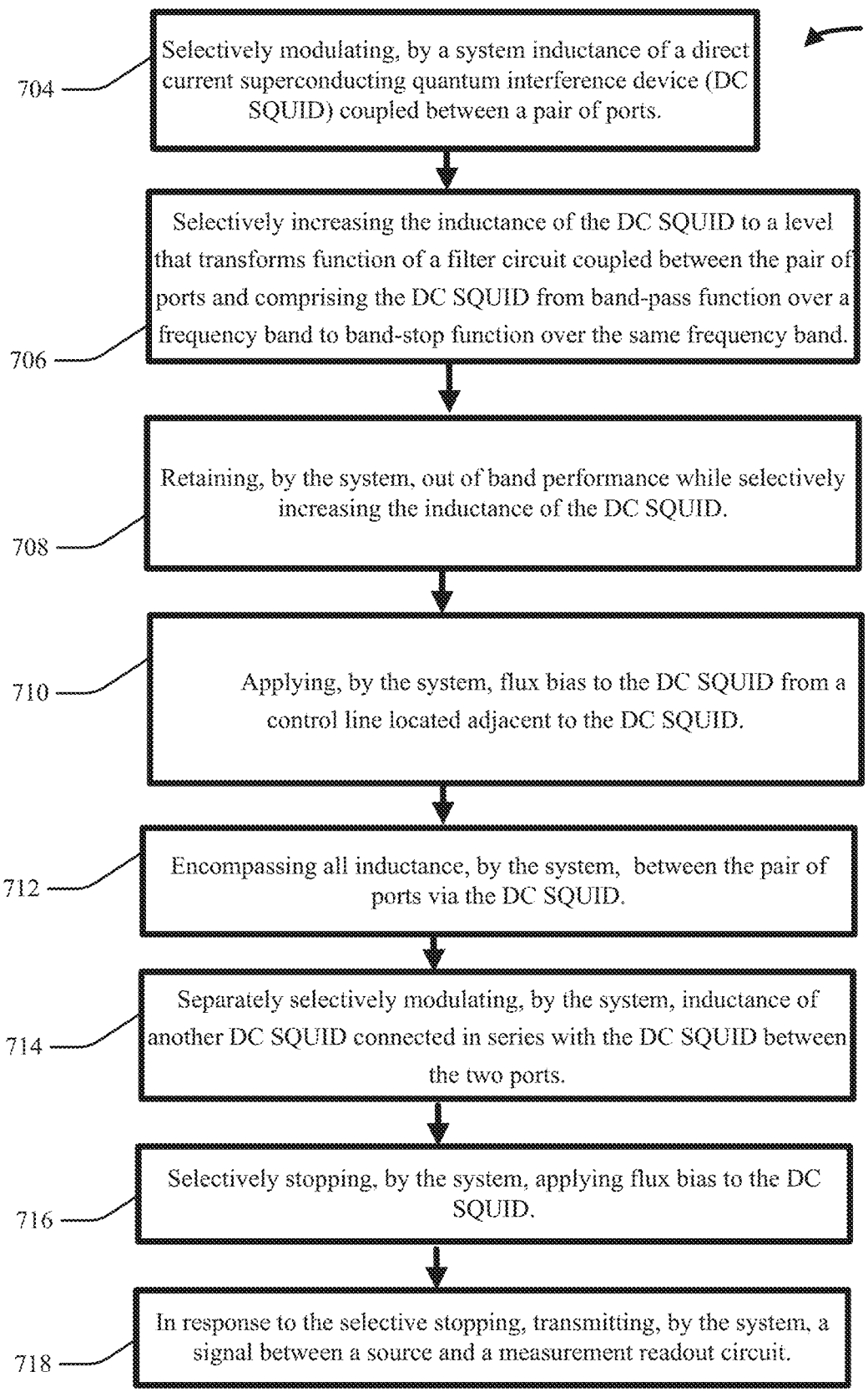
FIG. 7 illustrates a flow diagram of an example, non-limiting method that can facilitate use of a device, in accordance with one or more embodiments described herein.

Next, FIG. 7 illustrates a flow diagram of an example, non-limiting method 700 that can facilitate a process to switch a filter circuit device between BPF and BSF modes in accordance with one or more embodiments described herein, such as the filter circuit device 200 of FIG. 2. While the non-limiting method 700 is described relative to the filter circuit device 200 of FIG. 2, the non-limiting method 700 can be applicable also to other systems and/or devices described herein, such as the filter circuit devices 600, 650 and 658 of FIG. 6. Repetitive description of like elements and/or processes employed in respective embodiments is omitted for sake of brevity.

At 704, the non-limiting method 700 can comprise selectively modulating, by a system (e.g., quantum system 101), inductance of a direct current superconducting quantum interference device (DC SQUID) coupled between a pair of ports.

At 706, the non-limiting method 700 can comprise selectively increasing, by the system (e.g., quantum system 101), the inductance of the DC SQUID to a level that transforms function of a filter circuit coupled between the pair of ports and comprising the DC SQUID from band pass function over a frequency band to band stop function over the same frequency band. This can be achieved via modulation of critical current of the DC SQUID.

At 708, the non-limiting method 700 can comprise retaining, by the system (e.g., quantum system 101), out of band performance while selectively increasing the inductance of the DC SQUID.

At 710, the non-limiting method 700 can comprise applying, by the system (e.g., quantum system 101), flux bias to the DC SQUID from a control line located adjacent to the DC SQUID.

At 712, the non-limiting method 700 can comprise encompassing all inductance, by the system (e.g., by DC SQUIDs 208), between the pair of ports via the DC SQUID.

At 714, the non-limiting method 700 can comprise separately selectively modulating, by the system (e.g., quantum system 101), inductance of another DC SQUID connected in series with the DC SQUID between the two ports.

At 716, the non-limiting method 700 can comprise selectively stopping, by the system (e.g., quantum system 101), applying flux bias to the DC SQUID.

At 718, the non-limiting method 700 can comprise in response to the selective stopping, by the system (e.g., quantum system 101), transmitting, by the system (e.g., quantum system 101) a signal between a source (e.g., a qubit 107A, 107B, 107C) and a measurement readout circuit (e.g., control/readout electronics 109).

For simplicity of explanation, the computer-implemented and non-computer-implemented methodologies provided herein are depicted and/or described as a series of acts. The subject innovation is not limited by the acts illustrated and/or by the order of acts, for example acts can occur in one or more orders and/or concurrently, and with other acts not presented and described herein. Furthermore, not all illustrated acts can be utilized to implement the computer-implemented and non-computer-implemented methodologies in accordance with the described subject matter. In addition, the computer-implemented and non-computer-implemented methodologies could alternatively be represented as a series of interrelated states via a state diagram or events. Additionally, the computer-implemented methodologies described hereinafter and throughout this specification are capable of being stored on an article of manufacture to facilitate transporting and transferring the computer-implemented methodologies to computers. The term article of manufacture, as used herein, is intended to encompass a computer program accessible from any computer-readable device or storage media.

In summary, one or more systems, devices and/or methods of use provided herein relate to a filter circuit device 200, 600, 650, 680 that can facilitate selective switching between band pass and band stop filter modes and/or can provide reflectionless or near reflectionless function. A filter circuit device 200, 600, 650, 680 can comprise a filter circuit coupled between a pair of ports 206A, 206B and comprising a direct current superconducting quantum interference device (DC SQUID) 208, 608, 658, 688, wherein the filter circuit is selectively activatable by varying the inductance of the DC SQUID 208, 608, 658, 688. Applying flux bias to the DC SQUID 208, 608, 658, 688 can allow for the switching between the band pass and band stop filter modes.

One or more embodiments described herein relate to selective coupling and decoupling between a control circuit and a circuit being controlled, also referred to herein as a controllable circuit. The selective coupling can be provided by a filter circuit that can selectively switch from band pass function to band stop function. This selective function can allow for brief, such as quick, connection and/or routing of control and/or bias signals in a microwave network. When selectively reverted to band stop function, the filter circuit can allow for suppression of standing waves, such as from slight Z mismatches in the wiring network at connection points. In the quantum space, the filter circuit, when employed at a cryogenic environment, and when in a band stop mode, can suppress mismatches, such as noise, between room temperature control electronics, such as readout electronics and superconducting qubits in the cryogenic environment. In a band pass mode, the filter circuit can allow for control of the superconducting qubits by the room temperature control electronics, such as to facilitate readout of one or more states or resonant frequencies of one or more physical, real-world qubits in the cryogenic environment.

Furthermore, in one or more embodiments, a filter circuit described herein can provide majoratively reflectionless, near reflectionless and/or reflectionless filtering, such as by majoratively matching, near matching and/or perfectly matching an out of band signal to ground to yield majoratively no or zero reflections.

Moreover, a device and/or method described herein can be implemented in one or more domains, such as quantum domains, to enable scaled quantum program executions. Indeed, use of a device as described herein can be scalable, such as where a device described herein can be employed to generate a waveform relative to one or more qubits of a multi-qubit system. Thus, increased scaling of qubits provided in a cryogenic chamber can be enabled.

The systems and/or devices have been (and/or will be further) described herein with respect to interaction between one or more components. Such systems and/or components can include those components or sub-components specified therein, one or more of the specified components and/or sub-components, and/or additional components. Sub-components can be implemented as components communicatively coupled to other components rather than included within parent components. One or more components and/or sub-components can be combined into a single component providing aggregate functionality. The components can interact with one or more other components not specifically described herein for the sake of brevity, but known by those of skill in the art.

One or more embodiments described herein can be, in one or more embodiments, inherently and/or inextricably tied to computer technology and cannot be implemented outside of a computing environment. For example, one or more processes performed by one or more embodiments described herein can more efficiently, and even more feasibly, provide program and/or program instruction execution, such as relative to control of in band and out of band frequencies, as compared to existing systems and/or techniques. Systems, computer-implemented methods and/or computer program products facilitating performance of these processes are of great utility in the field of quantum computing and superconducting quantum systems and cannot be equally practicably implemented in a sensible way outside of a computing environment.

One or more embodiments described herein can employ hardware and/or software to solve problems that are highly technical, that are not abstract, and that cannot be performed as a set of mental acts by a human. For example, neither can the human mind nor a human with pen and paper switch a mode of a filter circuit device between a BPF mode and a BSF mode, as conducted by one or more embodiments described herein.

In one or more embodiments, one or more of the processes described herein can be performed by one or more specialized computers (e.g., a specialized processing unit, a specialized classical computer, a specialized quantum computer, a specialized hybrid classical/quantum system and/or another type of specialized computer) to execute defined tasks related to the one or more technologies describe above. One or more embodiments described herein and/or components thereof can be employed to solve new problems that arise through advancements in technologies mentioned above, employment of quantum computing systems, cloud computing systems, computer architecture and/or another technology.

One or more embodiments described herein can be fully operational towards performing one or more other functions (e.g., fully powered on, fully executed and/or another function) while also performing the one or more operations described herein.

Figure 8:
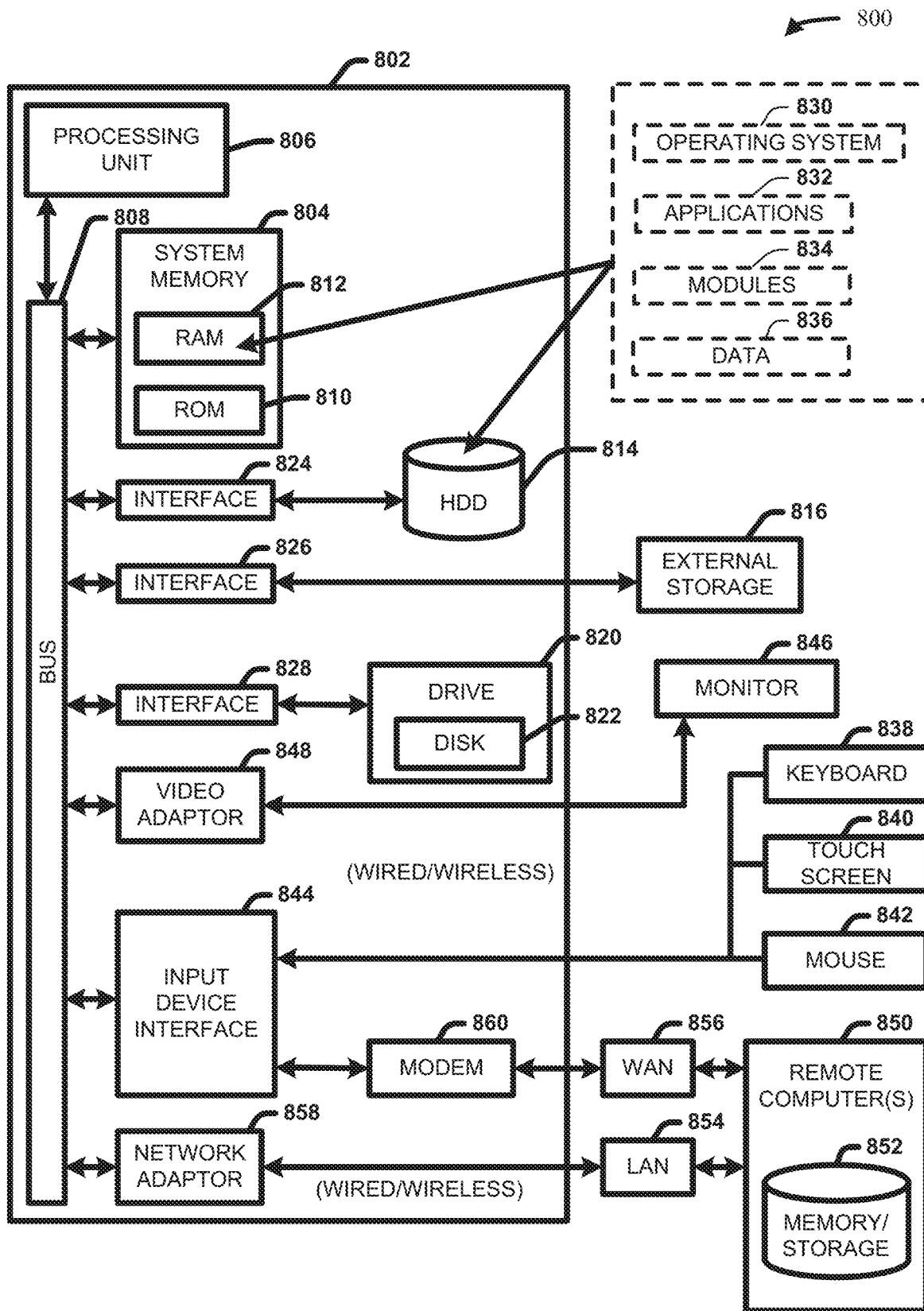
FIG. 8 illustrates a block diagram of an example, non-limiting, operating environment in which one or more embodiments described herein can be facilitated.
Figure 9:
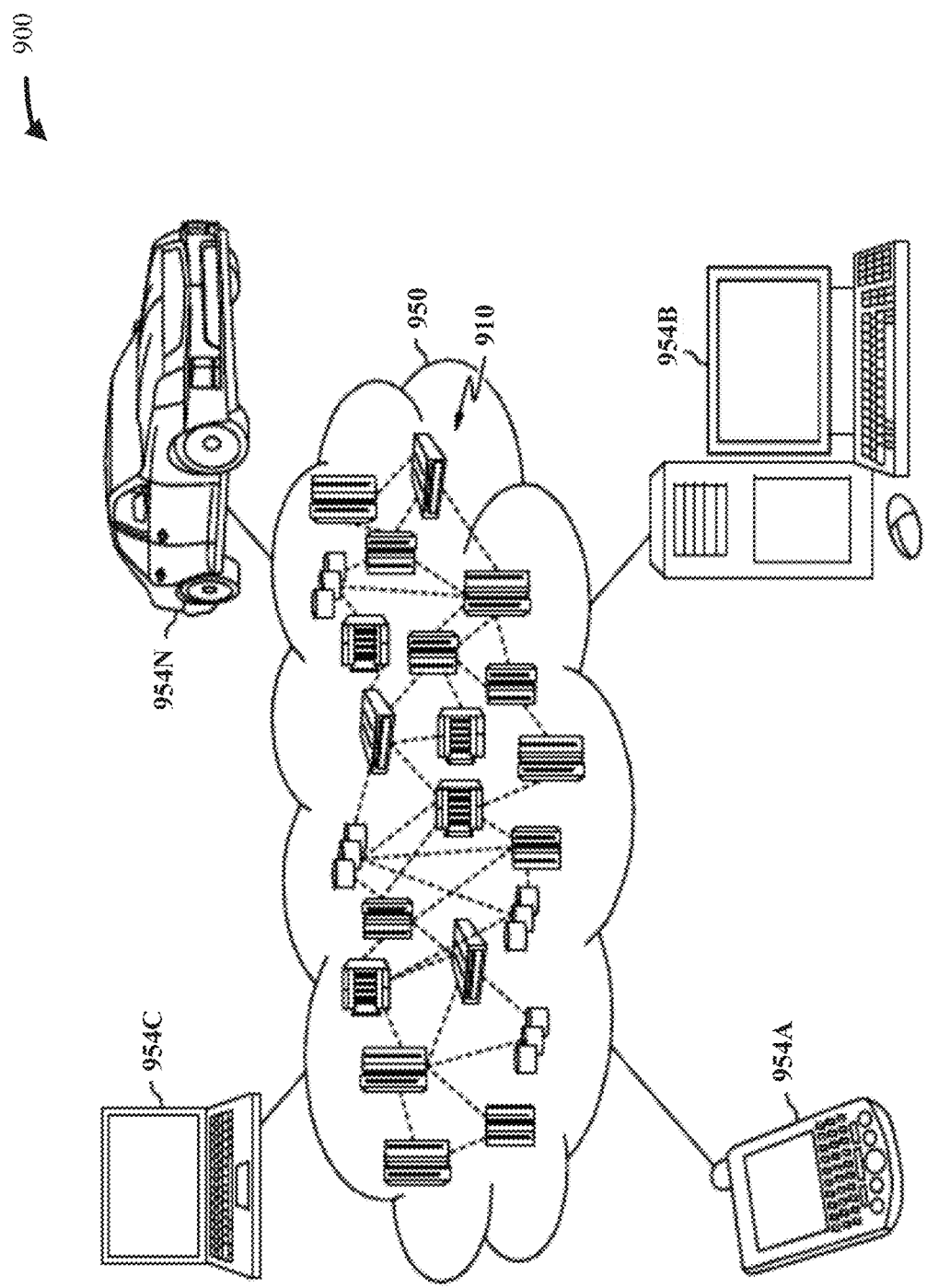
FIG. 9 illustrates a block diagram of an example, non-limiting, cloud computing environment in accordance with one or more embodiments described herein.
Figure 10:
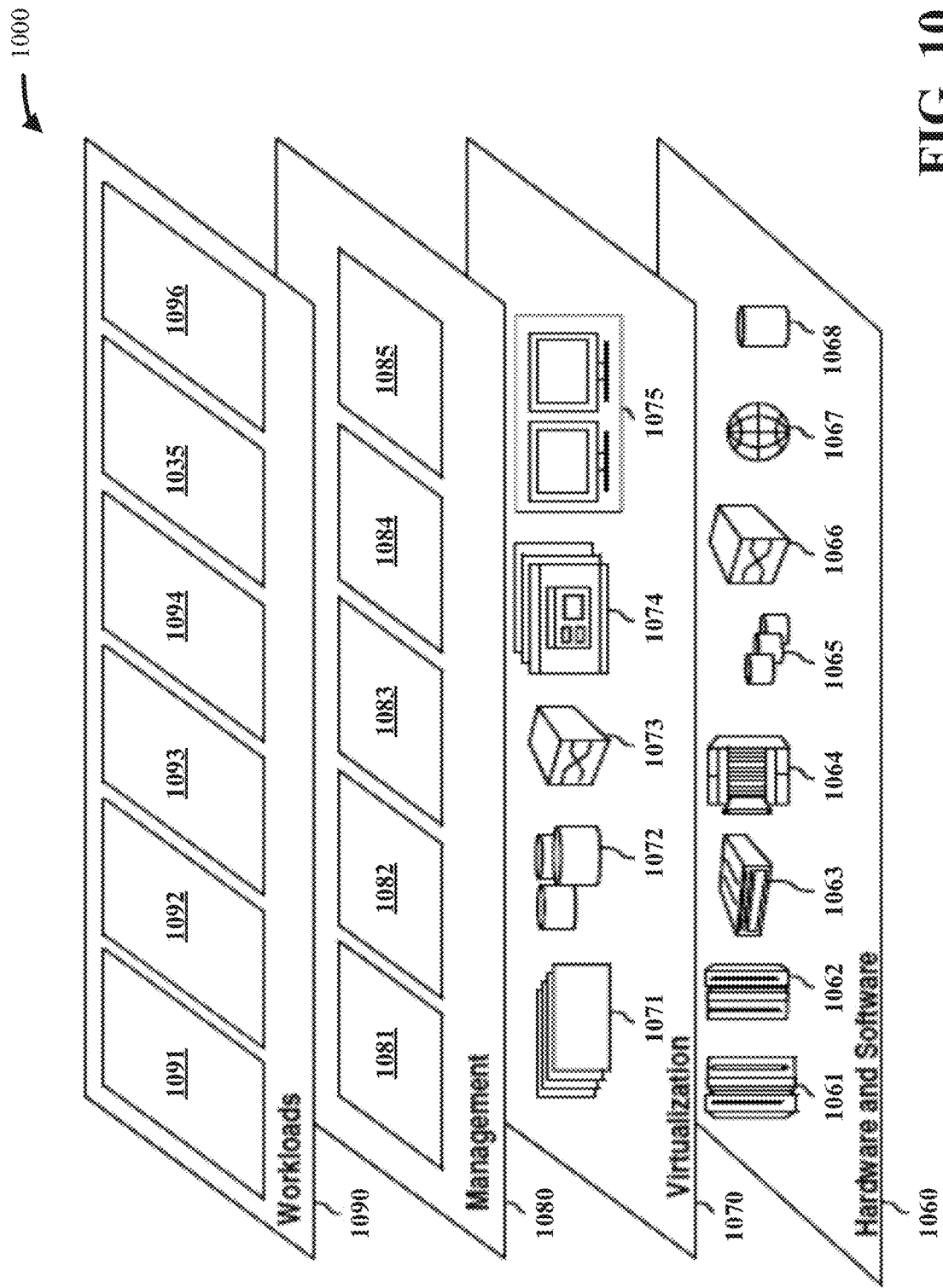
FIG. 10 illustrates a block diagram of example, non-limiting, abstraction model layers in accordance with one or more embodiments described herein.

Turning next to FIGS. 8-10, a detailed description is provided of additional context for the one or more embodiments described herein at FIGS. 1-7.

FIG. 8 and the following discussion are intended to provide a brief, general description of a suitable operating environment 800 in which one or more embodiments described herein at FIGS. 1-7 can be implemented. For example, one or more components and/or other aspects of embodiments described herein can be implemented in or be associated with, such as accessible via, the operating environment 800. Further, while one or more embodiments have been described above in the general context of computer-executable instructions that can run on one or more computers, those skilled in the art will recognize that one or more embodiments also can be implemented in combination with other program modules and/or as a combination of hardware and software.

Generally, program modules include routines, programs, components, data structures and/or the like, that perform particular tasks and/or implement particular abstract data types. Moreover, the inventive methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and/or the like, each of which can be operatively coupled to one or more associated devices.

Computing devices typically include a variety of media, which can include computer-readable storage media, machine-readable storage media and/or communications media, which two terms are used herein differently from one another as follows. Computer-readable storage media or machine-readable storage media can be any available storage media that can be accessed by the computer and includes both volatile and nonvolatile media, removable and non-removable media. By way of example, but not limitation, computer-readable storage media and/or machine-readable storage media can be implemented in connection with any method or technology for storage of information such as computer-readable and/or machine-readable instructions, program modules, structured data and/or unstructured data.

Computer-readable storage media can include, but are not limited to, random access memory (RAM), read only memory (ROM), electrically erasable programmable read only memory (EEPROM), flash memory or other memory technology, compact disk read only memory (CD ROM), digital versatile disk (DVD), Blu-ray disc (BD) and/or other optical disk storage, magnetic cassettes, magnetic tape, magnetic disk storage and/or other magnetic storage devices, solid state drives or other solid state storage devices and/or other tangible and/or non-transitory media which can be used to store specified information. In this regard, the terms "tangible" or "non-transitory" herein as applied to storage, memory and/or computer-readable media, are to be understood to exclude only propagating transitory signals per se as modifiers and do not relinquish rights to all standard storage, memory and/or computer-readable media that are not only propagating transitory signals per se.

Computer-readable storage media can be accessed by one or more local or remote computing devices, e.g., via access requests, queries and/or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set and/or changed in such a manner as to encode information in one or more signals. By way of example, but not limitation, communication media can include wired media, such as a wired network, direct-wired connection and/or wireless media such as acoustic, RF, infrared and/or other wireless media.

With reference again to FIG. 8, the example operating environment 800 for implementing one or more embodiments of the aspects described herein can include a computer 802, the computer 802 including a processing unit 806, a system memory 804 and/or a system bus 808. One or more aspects of the processing unit 806 can be applied to processors such as 106 of the non-limiting system 100. The processing unit 806 can be implemented in combination with and/or alternatively to processors such as 106.

Memory 804 can store one or more computer and/or machine readable, writable and/or executable components and/or instructions that, when executed by processing unit 806 (e.g., a classical processor, a quantum processor and/or like processor), can facilitate performance of operations defined by the executable component(s) and/or instruction(s). For example, memory 804 can store computer and/or machine readable, writable and/or executable components and/or instructions that, when executed by processing unit 806, can facilitate execution of the one or more functions described herein relating to non-limiting system 100, as described herein with or without reference to the one or more figures of the one or more embodiments.

Memory 804 can comprise volatile memory (e.g., random access memory (RAM), static RAM (SRAM), dynamic RAM (DRAM) and/or the like) and/or non-volatile memory (e.g., read only memory (ROM), programmable ROM (PROM), electrically programmable ROM (EPROM), electrically erasable programmable ROM (EEPROM) and/or the like) that can employ one or more memory architectures.

Processing unit 806 can comprise one or more types of processors and/or electronic circuitry (e.g., a classical processor, a quantum processor and/or like processor) that can implement one or more computer and/or machine readable, writable and/or executable components and/or instructions that can be stored at memory 804. For example, processing unit 806 can perform one or more operations that can be specified by computer and/or machine readable, writable and/or executable components and/or instructions including, but not limited to, logic, control, input/output (I/O), arithmetic and/or the like. In one or more embodiments, processing unit 806 can be any of one or more commercially available processors. In one or more embodiments, processing unit 806 can comprise one or more central processing unit, multi-core processor, microprocessor, dual microprocessors, microcontroller, System on a Chip (SOC), array processor, vector processor, quantum processor and/or another type of processor. The examples of processing unit 806 can be employed to implement one or more embodiments described herein.

The system bus 808 can couple system components including, but not limited to, the system memory 804 to the processing unit 806. The system bus 808 can comprise one or more types of bus structure that can further interconnect to a memory bus (with or without a memory controller), a peripheral bus and/or a local bus using one or more of a variety of commercially available bus architectures. The system memory 804 can include ROM 810 and/or RAM 812. A basic input/output system (BIOS) can be stored in a non-volatile memory such as ROM, erasable programmable read only memory (EPROM) and/or EEPROM, which BIOS contains the basic routines that help to transfer information among elements within the computer 802, such as during startup. The RAM 812 can include a high-speed RAM, such as static RAM for caching data.

The computer 802 can include an internal hard disk drive (HDD) 814 (e.g., EIDE, SATA), one or more external storage devices 816 (e.g., a magnetic floppy disk drive (FDD), a memory stick or flash drive reader, a memory card reader and/or the like) and/or a drive 820, e.g., such as a solid state drive or an optical disk drive, which can read or write from a disk 822, such as a CD-ROM disc, a DVD, a BD and/or the like. Additionally, and/or alternatively, where a solid state drive is involved, disk 822 could not be included, unless separate. While the internal HDD 814 is illustrated as located within the computer 802, the internal HDD 814 can also be configured for external use in a suitable chassis (not shown). Additionally, while not shown in operating environment 800, a solid state drive (SSD) can be used in addition to, or in place of, an HDD 814. The HDD 814, external storage device(s) 816 and drive 820 can be connected to the system bus 808 by an HDD interface 824, an external storage interface 826 and a drive interface 828, respectively. The HDD interface 824 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 802, the drives and storage media accommodate the storage of any data in a suitable digital format. Although the description of computer-readable storage media above refers to respective types of storage devices, other types of storage media which are readable by a computer, whether presently existing or developed in the future, can also be used in the example operating environment, and/or that any such storage media can contain computer-executable instructions for performing the methods described herein.

A number of program modules can be stored in the drives and RAM 812, including an operating system 830, one or more applications 832, other program modules 834 and/or program data 836. All or portions of the operating system, applications, modules and/or data can also be cached in the RAM 812. The systems and/or methods described herein can be implemented utilizing one or more commercially available operating systems and/or combinations of operating systems.

Computer 802 can optionally comprise emulation technologies. For example, a hypervisor (not shown) or other intermediary can emulate a hardware environment for operating system 830, and the emulated hardware can optionally be different from the hardware illustrated in FIG. 8. In a related embodiment, operating system 830 can comprise one virtual machine (VM) of multiple VMs hosted at computer 802. Furthermore, operating system 830 can provide runtime environments, such as the JAVA runtime environment or the .NET framework, for applications 832. Runtime environments are consistent execution environments that can allow applications 832 to run on any operating system that includes the runtime environment. Similarly, operating system 830 can support containers, and applications 832 can be in the form of containers, which are lightweight, standalone, executable packages of software that include, e.g., code, runtime, system tools, system libraries and/or settings for an application.

Further, computer 802 can be enabled with a security module, such as a trusted processing module (TPM). For instance, with a TPM, boot components hash next in time boot components and wait for a match of results to secured values before loading a next boot component. This process can take place at any layer in the code execution stack of computer 802, e.g., applied at application execution level and/or at operating system (OS) kernel level, thereby enabling security at any level of code execution.

An entity can enter and/or transmit commands and/or information into the computer 802 through one or more wired/wireless input devices, e.g., a keyboard 838, a touch screen 840 and/or a pointing device, such as a mouse 842. Other input devices (not shown) can include a microphone, an infrared (IR) remote control, a radio frequency (RF) remote control and/or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint and/or iris scanner, and/or the like. These and other input devices can be connected to the processing unit 806 through an input device interface 844 that can be coupled to the system bus 808, but can be connected by other interfaces, such as a parallel port, an IEEE 1394 serial port, a game port, a USB port, an IR interface, a BLUETOOTH® interface and/or the like.

A monitor 846 or other type of display device can be alternatively and/or additionally connected to the system bus 808 via an interface, such as a video adapter 848. In addition to the monitor 846, a computer typically includes other peripheral output devices (not shown), such as speakers, printers and/or the like.

The computer 802 can operate in a networked environment using logical connections via wired and/or wireless communications to one or more remote computers, such as a remote computer(s) 850. The remote computer(s) 850 can be a workstation, a server computer, a router, a personal computer, portable computer, microprocessor-based entertainment appliance, a peer device and/or other common network node, and typically includes many or all of the elements described relative to the computer 802, although, for purposes of brevity, only a memory/storage device 852 is illustrated. Additionally, and/or alternatively, the computer 802 can be coupled (e.g., communicatively, electrically, operatively, optically and/or the like) to one or more external systems, sources and/or devices (e.g., classical and/or quantum computing devices, communication devices and/or like device) via a data cable (e.g., High-Definition Multimedia Interface (HDMI), recommended standard (RS) 232, Ethernet cable and/or the like).

In one or more embodiments, a network can comprise one or more wired and/or wireless networks, including, but not limited to, a cellular network, a wide area network (WAN) (e.g., the Internet), or a local area network (LAN). For example, one or more embodiments described herein can communicate with one or more external systems, sources and/or devices, for instance, computing devices (and vice versa) using virtually any specified wired or wireless technology, including but not limited to: wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra mobile broadband (UMB), high speed packet access (HSPA), Zigbee and other 802.XX wireless technologies and/or legacy telecommunication technologies, BLU- ETOOTH®, Session Initiation Protocol (SIP), ZIGBEE®, RF4CE protocol, WirelessHART protocol, 6LoWPAN (IPv6 over Low power Wireless Area Networks), Z-Wave, an ANT, an ultra-wideband (UWB) standard protocol and/or other proprietary and/or non-proprietary communication protocols. In a related example, one or more embodiments described herein can include hardware (e.g., a central processing unit (CPU), a transceiver, a decoder, quantum hardware, a quantum processor and/or the like), software (e.g., a set of threads, a set of processes, software in execution, quantum pulse schedule, quantum circuit, quantum gates and/or the like) and/or a combination of hardware and/or software that facilitates communicating information among one or more embodiments described herein and external systems, sources and/or devices (e.g., computing devices, communication devices and/or the like).

The logical connections depicted include wired/wireless connectivity to a local area network (LAN) 854 and/or larger networks, e.g., a wide area network (WAN) 856. LAN and WAN networking environments can be commonplace in offices and companies and can facilitate enterprise-wide computer networks, such as intranets, all of which can connect to a global communications network, e.g., the Internet.

When used in a LAN networking environment, the computer 802 can be connected to the local network 854 through a wired and/or wireless communication network interface or adapter 858. The adapter 858 can facilitate wired and/or wireless communication to the LAN 854, which can also include a wireless access point (AP) disposed thereon for communicating with the adapter 858 in a wireless mode.

When used in a WAN networking environment, the computer 802 can include a modem 860 and/or can be connected to a communications server on the WAN 856 via other means for establishing communications over the WAN 856, such as by way of the Internet. The modem 860, which can be internal and/or external and a wired and/or wireless device, can be connected to the system bus 808 via the input device interface 844. In a networked environment, program modules depicted relative to the computer 802 or portions thereof can be stored in the remote memory/storage device 852. The network connections shown are merely exemplary and one or more other means of establishing a communications link among the computers can be used.

When used in either a LAN or WAN networking environment, the computer 802 can access cloud storage systems or other network-based storage systems in addition to, and/or in place of, external storage devices 816 as described above, such as but not limited to, a network virtual machine providing one or more aspects of storage and/or processing of information. Generally, a connection between the computer 802 and a cloud storage system can be established over a LAN 854 or WAN 856 e.g., by the adapter 858 or modem 860, respectively. Upon connecting the computer 802 to an associated cloud storage system, the external storage interface 826 can, such as with the aid of the adapter 858 and/or modem 860, manage storage provided by the cloud storage system as it would other types of external storage. For instance, the external storage interface 826 can be configured to provide access to cloud storage sources as if those sources were physically connected to the computer 802.

The computer 802 can be operable to communicate with any wireless devices and/or entities operatively disposed in wireless communication, e.g., a printer, scanner, desktop and/or portable computer, portable data assistant, communications satellite, telephone and/or any piece of equipment or location associated with a wirelessly detectable tag (e.g., a kiosk, news stand, store shelf and/or the like). This can include Wireless Fidelity (Wi-Fi) and BLUETOOTH® wireless technologies. Thus, the communication can be a predefined structure as with a conventional network or simply an ad hoc communication between at least two devices.

The illustrated embodiments described herein can be employed relative to distributed computing environments (e.g., cloud computing environments), such as described below with respect to FIG. 9, where certain tasks are performed by remote processing devices that are linked through a communications network. In a distributed computing environment, program modules can be located both in local and/or remote memory storage devices.

For example, one or more embodiments described herein and/or one or more components thereof can employ one or more computing resources of the cloud computing environment 950 described below with reference to FIG. 9, and/or with reference to the one or more functional abstraction layers (e.g., quantum software and/or the like) described below with reference to FIG. 10, to execute one or more operations in accordance with one or more embodiments described herein. For example, cloud computing environment 950 and/or one or more of the functional abstraction layers 1060, 1070, 1080 and/or 1090 can comprise one or more classical computing devices (e.g., classical computer, classical processor, virtual machine, server and/or the like), quantum hardware and/or quantum software (e.g., quantum computing device, quantum computer, quantum processor, quantum circuit simulation software, superconducting circuit and/or the like) that can be employed by one or more embodiments described herein and/or components thereof to execute one or more operations in accordance with one or more embodiments described herein. For instance, one or more embodiments described herein and/or components thereof can employ such one or more classical and/or quantum computing resources to execute one or more classical and/or quantum: mathematical function, calculation and/or equation; computing and/or processing script; algorithm; model (e.g., artificial intelligence (AI) model, machine learning (ML) model and/or like model); and/or other operation in accordance with one or more embodiments described herein.

It is to be understood that although one or more embodiments described herein include a detailed description on cloud computing, implementation of the teachings recited herein are not limited to a cloud computing environment. Rather, one or more embodiments described herein are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines and/or services) that can be rapidly provisioned and released with minimal management effort or interaction with a provider of the service. This cloud model can include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but can specify location at a higher level of abstraction (e.g., country, state and/or datacenter).

Rapid elasticity: capabilities can be rapidly and elastically provisioned, in one or more cases automatically, to quickly scale out and rapidly released to quickly scale in. To the consumer, the capabilities available for provisioning can appear to be unlimited and can be purchased in any quantity at any time.

Measured service: cloud systems automatically control and optimize resource use by leveraging a metering capability at one or more levels of abstraction appropriate to the type of service (e.g., storage, processing, bandwidth and/or active user accounts). Resource usage can be monitored, controlled and/or reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage and/or individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems and/or storage, but has control over the deployed applications and possibly application hosting environment configurations.

Infrastructure as a Service (IaaS): the capability provided to the consumer is to provision processing, storage, networks and/or other fundamental computing resources where the consumer can deploy and run arbitrary software, which can include operating systems and applications. The consumer does not manage or control the underlying cloud infrastructure but has control over operating systems, storage, deployed applications and/or possibly limited control of select networking components (e.g., host firewalls).

Deployment Models are as follows:

Private cloud: the cloud infrastructure is operated solely for an organization. It can be managed by the organization or a third party and can exist on-premises or off-premises.

Community cloud: the cloud infrastructure is shared by several organizations and supports a specific community that has shared concerns (e.g., mission, security requirements, policy and/or compliance considerations). It can be managed by the organizations or a third party and can exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community or public) that remain unique entities but are bound together by standardized or proprietary technology that enables data and application portability (e.g., cloud bursting for load-balancing among clouds).

A cloud computing environment is service oriented with a focus on statelessness, low coupling, modularity and/or semantic interoperability. At the heart of cloud computing is an infrastructure that includes a network of interconnected nodes.

Moreover, the non-limiting system 100 and/or the example operating environment 800 can be associated with and/or be included in a data analytics system, a data processing system, a graph analytics system, a graph processing system, a big data system, a social network system, a speech recognition system, an image recognition system, a graphical modeling system, a bioinformatics system, a data compression system, an artificial intelligence system, an authentication system, a syntactic pattern recognition system, a medical system, a health monitoring system, a network system, a computer network system, a communication system, a router system, a server system, a high availability server system (e.g., a Telecom server system), a Web server system, a file server system, a data server system, a disk array system, a powered insertion board system, a cloud-based system and/or the like. In accordance therewith, non-limiting system 100 and/or example operating environment 800 can be employed to use hardware and/or software to solve problems that are highly technical in nature, that are not abstract and/or that cannot be performed as a set of mental acts by a human.

Referring now to details of one or more aspects illustrated at FIG. 9, the illustrative cloud computing environment 950 is depicted. As shown, cloud computing environment 950 includes one or more cloud computing nodes 910 with which local computing devices used by cloud consumers, such as, for example, personal digital assistant (PDA) or cellular telephone 954A, desktop computer 954B, laptop computer 954C and/or automobile computer system 954N can communicate. Although not illustrated in FIG. 9, cloud computing nodes 910 can further comprise a quantum platform (e.g., quantum computer, quantum hardware, quantum software and/or the like) with which local computing devices used by cloud consumers can communicate. Cloud computing nodes 910 can communicate with one another. They can be grouped (not shown) physically or virtually, in one or more networks, such as Private, Community, Public, or Hybrid clouds as described hereinabove, or a combination thereof. This allows cloud computing environment 950 to offer infrastructure, platforms and/or software as services for which a cloud consumer does not need to maintain resources on a local computing device. It is understood that the types of computing devices 954A-N shown in FIG. 9 are intended to be illustrative only and that cloud computing nodes 910 and cloud computing environment 950 can communicate with any type of computerized device over any type of network and/or network addressable connection (e.g., using a web browser).

Referring now to details of one or more aspects illustrated at FIG. 10, a set 1000 of functional abstraction layers is shown, such as provided by cloud computing environment 950 (FIG. 9). One or more embodiments described herein can be associated with, such as accessible via, one or more functional abstraction layers described below with reference to FIG. 10 (e.g., hardware and software layer 1060, virtualization layer 1070, management layer 1080 and/or workloads layer 1090). It should be understood in advance that the components, layers and/or functions shown in FIG. 10 are intended to be illustrative only and embodiments described herein are not limited thereto. As depicted, the following layers and/or corresponding functions are provided:

Hardware and software layer 1060 can include hardware and software components. Examples of hardware components include: mainframes 1061; RISC (Reduced Instruction Set Computer) architecture-based servers 1062; servers 1063; blade servers 1064; storage devices 1065; and/or networks and/or networking components 1066. In one or more embodiments, software components can include network application server software 1067, quantum platform routing software 1068; and/or quantum software (not illustrated in FIG. 10).

Virtualization layer 1070 can provide an abstraction layer from which the following examples of virtual entities can be provided: virtual servers 1071; virtual storage 1072; virtual networks 1073, including virtual private networks; virtual applications and/or operating systems 1074; and/or virtual clients 1075.

In one example, management layer 1080 can provide the functions described below. Resource provisioning 1081 can provide dynamic procurement of computing resources and other resources that can be utilized to perform tasks within the cloud computing environment. Metering and Pricing 1082 can provide cost tracking as resources are utilized within the cloud computing environment, and/or billing and/or invoicing for consumption of these resources. In one example, these resources can include one or more application software licenses. Security can provide identity verification for cloud consumers and/or tasks, as well as protection for data and/or other resources. User (or entity) portal 1083 can provide access to the cloud computing environment for consumers and system administrators. Service level management 1084 can provide cloud computing resource allocation and/or management such that required service levels are met. Service Level Agreement (SLA) planning and fulfillment 1085 can provide pre-arrangement for, and procurement of, cloud computing resources for which a future requirement is anticipated in accordance with an SLA.

Workloads layer 1090 can provide examples of functionality for which the cloud computing environment can be utilized. Non-limiting examples of workloads and functions which can be provided from this layer include: mapping and navigation 1091; software development and lifecycle management 1092; virtual classroom education delivery 1093; data analytics processing 1094; transaction processing 1095; and/or application transformation software 1096.

The embodiments described herein can be directed to one or more of a system, a method, an apparatus and/or a computer program product at any possible technical detail level of integration. The computer program product can include a computer readable storage medium (or media) having computer readable program instructions thereon for causing a processor to carry out aspects of the one or more embodiments described herein. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a superconducting storage device and/or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon and/or any suitable combination of the foregoing. A computer readable storage medium, as used herein, is not to be construed as being transitory signals per se, such as radio waves and/or other freely propagating electromagnetic waves, electromagnetic waves propagating through a waveguide and/or other transmission media (e.g., light pulses passing through a fiber-optic cable), and/or electrical signals transmitted through a wire.

Computer readable program instructions described herein can be downloaded to respective computing/processing devices from a computer readable storage medium and/or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the one or more embodiments described herein can be assembler instructions, instruction-set-architecture (ISA) instructions, machine instructions, machine dependent instructions, microcode, firmware instructions, state-setting data, configuration data for integrated circuitry, and/or source code and/or object code written in any combination of one or more programming languages, including an object oriented programming language such as Smalltalk, C++ or the like, and/or procedural programming languages, such as the "C" programming language and/or similar programming languages. The computer readable program instructions can execute entirely on a computer, partly on a computer, as a stand-alone software package, partly on a computer and/or partly on a remote computer or entirely on the remote computer and/or server. In the latter scenario, the remote computer can be connected to a computer through any type of network, including a local area network (LAN) and/or a wide area network (WAN), and/or the connection can be made to an external computer (for example, through the Internet using an Internet Service Provider). In one or more embodiments, electronic circuitry including, for example, programmable logic circuitry, field-programmable gate arrays (FPGA) and/or programmable logic arrays (PLA) can execute the computer readable program instructions by utilizing state information of the computer readable program instructions to personalize the electronic circuitry, in order to perform aspects of the one or more embodiments described herein.

Aspects of the one or more embodiments described herein are described with reference to flowchart illustrations and/or block diagrams of methods, apparatus (systems), and computer program products according to one or more embodiments described herein. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer and/or other programmable data processing apparatus to produce a machine, such that the instructions, which execute via the processor of the computer or other programmable data processing apparatus, can create means for implementing the functions/acts specified in the flowchart and/or block diagram block or blocks. These computer readable program instructions can also be stored in a computer readable storage medium that can direct a computer, a programmable data processing apparatus and/or other devices to function in a particular manner, such that the computer readable storage medium having instructions stored therein can comprise an article of manufacture including instructions which can implement aspects of the function/act specified in the flowchart and/or block diagram block or blocks. The computer readable program instructions can also be loaded onto a computer, other programmable data processing apparatus and/or other device to cause a series of operational acts to be performed on the computer, other programmable apparatus and/or other device to produce a computer implemented process, such that the instructions which execute on the computer, other programmable apparatus and/or other device implement the functions/acts specified in the flowchart and/or block diagram block or blocks.

The flowcharts and block diagrams in the figures illustrate the architecture, functionality and/or operation of possible implementations of systems, computer-implementable methods and/or computer program products according to one or more embodiments described herein. In this regard, each block in the flowchart or block diagrams can represent a module, segment and/or portion of instructions, which comprises one or more executable instructions for implementing the specified logical function(s). In one or more alternative implementations, the functions noted in the blocks can occur out of the order noted in the Figures. For example, two blocks shown in succession can be executed substantially concurrently, and/or the blocks can sometimes be executed in the reverse order, depending upon the functionality involved. It will also be noted that each block of the block diagrams and/or flowchart illustration, and/or combinations of blocks in the block diagrams and/or flowchart illustration, can be implemented by special purpose hardware-based systems that can perform the specified functions and/or acts and/or carry out one or more combinations of special purpose hardware and/or computer instructions.

While the subject matter has been described above in the general context of computer-executable instructions of a computer program product that runs on a computer and/or computers, those skilled in the art will recognize that the one or more embodiments herein also can be implemented in combination with one or more other program modules. Generally, program modules include routines, programs, components, data structures and/or the like that perform particular tasks and/or implement particular abstract data types. Moreover, the inventive computer-implemented methods can be practiced with other computer system configurations, including single-processor and/or multiprocessor computer systems, mini-computing devices, mainframe computers, as well as computers, hand-held computing devices (e.g., PDA, phone), microprocessor-based or programmable consumer and/or industrial electronics and/or the like. The illustrated aspects can also be practiced in distributed computing environments in which tasks are performed by remote processing devices that are linked through a communications network. However, one or more, if not all aspects of the one or more embodiments described herein can be practiced on stand-alone computers. In a distributed computing environment, program modules can be located in both local and remote memory storage devices.

As used in this application, the terms "component," "system," "platform," "interface," and/or the like, can refer to and/or can include a computer-related entity or an entity related to an operational machine with one or more specific functionalities. The entities described herein can be either hardware, a combination of hardware and software, software, or software in execution. For example, a component can be, but is not limited to being, a process running on a processor, a processor, an object, an executable, a thread of execution, a program and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system and/or across a network such as the Internet with other systems via the signal). As another example, a component can be an apparatus with specific functionality provided by mechanical parts operated by electric or electronic circuitry, which is operated by a software and/or firmware application executed by a processor. In such a case, the processor can be internal and/or external to the apparatus and can execute at least a part of the software and/or firmware application. As yet another example, a component can be an apparatus that provides specific functionality through electronic components without mechanical parts, where the electronic components can include a processor and/or other means to execute software and/or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter described herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit and/or device comprising, but not limited to, single-core processors; single-processors with software multithread execution capability; multi-core processors; multi-core processors with software multithread execution capability; multi-core processors with hardware multithread technology; parallel platforms; and/or parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, and/or any combination thereof designed to perform the functions described herein. Further, processors can exploit nano-scale architectures such as, but not limited to, molecular and quantum-dot based transistors, switches and/or gates, in order to optimize space usage and/or to enhance performance of related equipment. A processor can be implemented as a combination of computing processing units.

Herein, terms such as "store," "storage," "data store," data storage," "database," and substantially any other information storage component relevant to operation and functionality of a component are utilized to refer to "memory components," entities embodied in a "memory," or components comprising a memory. Memory and/or memory components described herein can be either volatile memory or nonvolatile memory or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory and/or nonvolatile random access memory (RAM) (e.g., ferroelectric RAM (FeRAM). Volatile memory can include RAM, which can act as external cache memory, for example. By way of illustration and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM) and/or Rambus dynamic RAM (RDRAM). Additionally, the described memory components of systems and/or computer-implemented methods herein are intended to include, without being limited to including, these and/or any other suitable types of memory.

What has been described above includes mere examples of systems and computer-implemented methods. It is, of course, not possible to describe every conceivable combination of components and/or computer-implemented methods for purposes of describing the one or more embodiments, but one of ordinary skill in the art can recognize that many further combinations and/or permutations of the one or more embodiments are possible. Furthermore, to the extent that the terms "includes," "has," "possesses," and the like are used in the detailed description, claims, appendices and/or drawings such terms are intended to be inclusive in a manner similar to the term "comprising" as "comprising" is interpreted when employed as a transitional word in a claim.

The descriptions of the one or more embodiments have been presented for purposes of illustration but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application and/or technical improvement over technologies found in the marketplace, and/or to enable others of ordinary skill in the art to understand the embodiments described herein.

What is claimed is:
1. A method, comprising:
selectively modulating, by a device operatively coupled to a processor, inductance of a direct current superconducting quantum interference device (DC SQUID) coupled between a pair of ports, wherein the selectively modulating the inductance comprises selectively increasing the inductance of the DC SQUID to a level that transforms function of a filter circuit coupled between the pair of ports and comprising the DC SQUID from band pass function over a frequency band to band stop function over the same frequency band.
2. The method of claim 1, further comprising:
retaining, by the device, out of band performance while selectively increasing the inductance of the DC SQUID.
3. The method of claim 1, wherein the selective modulation of the DC SQUID inductance comprises:
applying, by the device, flux bias to the DC SQUID from a control line located adjacent to the DC SQUID.
4. The method of claim 1, further comprising:
encompassing, by the device, all inductance between the pair of ports via the DC SQUID.
5. The method of claim 1, further comprising:
separately selectively modulating, by a device, inductance of another DC SQUID connected in series with the DC SQUID between the two ports.
6. The method of claim 1,
selectively stopping applying, by the device, flux bias to the DC SQUID; and
in response to the selective stopping, transmitting, by the device, a signal from a processor to a measurement readout circuit.
7. The method of claim 1, wherein the selectively modulating the inductance comprises selectively decreasing the inductance of the DC SQUID to another level that transforms function of the filter circuit co from the band stop function over the same frequency band to the band pass function over the same frequency band.
8. A device, comprising:
a filter circuit coupled between a pair of ports and comprising a direct current superconducting quantum interference device (DC SQUID), wherein the filter circuit is selectively activatable by varying the inductance of the DC SQUID;
a flux bias control line located adjacent to the DC SQUID.
9. The device of claim 8, wherein the DC SQUID provides only a portion of all inductance between the pair of ports.
10. The device of claim 8, wherein the DC SQUID encompasses all inductance between the pair of ports.
11. The device of claim 8, further comprising:
another DC SQUID connected in series between the ports with the DC SQUID, wherein the filter circuit is selectively activatable to separately vary inductances of the DC SQUID and of the another DC SQUID.
12. The device of claim 8, further comprising:
wherein the filter circuit is a reflectionless filter circuit.
13. The device of claim 8, wherein the flux bias control line applies flux bias to the DC SQUID.
14. A system, comprising:
a processor;
a measurement readout circuit; and
a filter circuit connected to the processor, wherein the filter circuit comprises a direct current superconducting quantum interference device (DC SQUID), wherein critical current of the DC SQUID is selectively modulable to increase the inductance of the DC SQUID.

15. The system of claim 14, wherein the filter circuit further comprises:
   a flux bias control line located adjacent to and that applies flux bias to the DC SQUID.

16. The system of claim 14, wherein the selective modulation of the critical current of the DC SQUID increases the inductance of the DC SQUID to a level that transforms function of the filter circuit from band pass function over a frequency band to band stop function over the same frequency band.

17. The system of claim 14, wherein the DC SQUID encompasses all inductance of the filter circuit.

18. The system of claim 14, wherein the isolator device further comprises:
   another DC SQUID connected in series with the DC SQUID, wherein critical currents of the DC SQUID and of the another DC SQUID are jointly selectively modulable to thereby increase a combined inductance of the DC SQUID and the another DC SQUID.

19. The system of claim 14, wherein the filter circuit further comprises:
   another DC SQUID connected in series with the DC SQUID, wherein the critical currents of the DC SQUID and of the another DC SQUID are separately selectively modulable to vary a combined inductance of the DC SQUID and the another DC SQUID.

20. The system of claim 14, in combination with a cryogenic chamber in which the filter circuit is retained.

* * * * *